(12) United States Patent
Lee (10) Patent No.: US 7,542,150 B2
(45) Date of Patent: Jun. 2, 2009

(54) DISPLACEMENT INTERFEROMETER SYSTEM AND EXPOSER USING THE SAME

(75) Inventor: Eui-Bang Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 176 days.

(21) Appl. No.: 11/655,373

(22) Filed: Jan. 19, 2007

(65) Prior Publication Data

US 2008/0013098 A1 Jan. 17, 2008

(30) Foreign Application Priority Data

Jul. 14, 2006 (KR) ........................ 10-2006-0066312

(51) Int. Cl.
*G01B 11/02* (2006.01)

(52) U.S. Cl. ...................... 356/498; 356/500

(58) Field of Classification Search ................ 356/486, 356/493, 496, 498, 500
See application file for complete search history.

(56) References Cited

U.S. PATENT DOCUMENTS

| | | | |
|---|---|---|---|
| 5,523,843 A * | 6/1996 | Yamane et al. ............... | 356/500 |
| 6,268,922 B1 | 7/2001 | Tazartes et al. | |
| 6,839,142 B2 * | 1/2005 | Isshiki et al. ................. | 356/498 |
| 6,897,963 B1 * | 5/2005 | Taniguchi et al. ............ | 356/500 |
| 6,912,054 B2 | 6/2005 | Hill | |
| 2003/0223079 A1 | 12/2003 | Hill | |
| 2005/0179909 A1 * | 8/2005 | Krijnen ....................... | 356/500 |
| 2006/0279743 A1 * | 12/2006 | Boesser et al. .............. | 356/500 |

* cited by examiner

*Primary Examiner*—Michael A Lyons
(74) *Attorney, Agent, or Firm*—Mills & Onello LLP (57) ABSTRACT

A displacement interferometer system comprises: a light source for generating a laser beam of a predetermined wavelength; an incidence unit for allowing the laser beam, generated in the light source to be incident on a target object to be measured; a detector for measuring a distance of the target object to be measured, using a measurement laser beam which is incident on the target object by the incidence unit; and a correction unit connected to the incidence unit so that a correction laser beam is incident in a direction parallel to the measurement laser beam which is incident on the target object to be measured. When the correction laser beam and the measurement laser beam which yaw from an initially set direction are incident in any one direction, the correction unit corrects the correction laser beam and the measurement laser beam to be incident in the initially set direction.

26 Claims, 7 Drawing Sheets

DISPLACEMENT INTERFEROMETER SYSTEM AND EXPOSER USING THE SAME

CROSS-REFERENCE TO RELATED APPLICATION

This application claims the benefit of Korean Patent Application No. 10-2006-0066312, filed Jul. 14, 2006, the contents of which are hereby incorporated herein by reference in their entirety.

BACKGROUND OF THE INVENTION

1. Technical Field

The present invention relates to semiconductor fabrication equipment, and more particularly, to a displacement interferometer system for measuring displacement of a wafer stage holding a wafer, and an exposer using the same.

2. Discussion of Related Art

Semiconductor devices are being developed quickly with the rapid development in the information and communication field and the popularization of information media such as computers. Semiconductor devices are also being developed functionally to meet the requirements of high speed operation and high capacitance. Research and development of the technology for fabricating semiconductor devices are conducted to maximize the integration density, reliability and operation speed thereof.

The technology for fabricating a semiconductor device includes a deposition process for forming a processing layer on a wafer; a photo-lithography process for forming a processed layer on the processing layer formed by the deposition process and patterning the processed layer; an etching process for etching the processing layer, using the processed layer formed by the photo-lithography process as a mask; an ion implantation process for implanting impurity ions, using the processed layer as an ion implantation mask; and various anneal processes.

For example, the photo-lithography process forms a photosensitive layer, such as photo-resist which is used as the mask during the etching process or ion implantation process, in a pattern to be realized on a semiconductor substrate. The photo-lithography process includes a photo-resist coating process, a soft bake process, an edge exposure process, a side rinse process, a hard bake process, an exposure process, and a development process.

The photo-lithography process is performed using semiconductor fabricating equipment such as a spinner and an exposer. Since the photo-lithography process is important and essential in determining critical dimensions of a semiconductor device during a semiconductor fabrication process, research and development of the photo-lithography process are actively in progress.

An exposer includes an exposure light source for generating a light of a short wavelength, such as ultraviolet and X-ray, to which the photo resist is exposed; a reticle for transferring the light of short wavelength, which is supplied by the exposure light source, to a predetermined pattern image; an optical system including an objective lens for transferring the light of short wavelength to the reticle and reducing and projecting the light of short wavelength transferred through the reticle; and a wafer stage for supporting, aligning and plane-moving the wafer so that the pattern image is reduced and projected at a corresponding position of the wafer.

The wafer stage moves the wafer positioned at the focal distance of the objective lens horizontally. For example, the wafer stage enables the wafer to be aligned and horizontally moved so that an alignment mark formed on the wafer corresponds to an alignment mark formed on the reticle. In a scanner exposer, when the pattern image formed on the reticle is scanned to be transferred to the wafer during the photo-lithography process, the wafer stage may move the wafer horizontally in one direction. Then, the reticle is parallel to the wafer stage by a reticle stage and is moved in the same direction or opposite direction. The reticle stage or the wafer stage is substantially linearly moved by a power system such as a servo motor, and a movement distance thereof is measured by an encoder. However, since the encoder has an error which is larger than the size of the pattern formed on the surface of the wafer, a displacement interferometer system with high accuracy for distance measurement is used, instead of the encoder.

A displacement interferometer system used in an exposer is described in detail in U.S. Pat. No. 6,912,054 entitled "Interferometric Stage System". The displacement interferometric stage system includes a support structure being fixed with a predetermined degree of planarity from the ground, a stage being horizontally moved on the support structure, a reflector being positioned on the stage, and an interferometer monitoring the position and orientation of the stage moved on the support structure, using a measurement beam.

The stage is set so as to be moved on a two-dimensional plane while horizontally supporting a wafer on the support structure. For example, the stage is divided into an upper stage and a lower stage which are moved, along the x-axis and the y-axis of the Cartesian coordinate system. The stage is linearly moved in one direction on a linear motion (LM) guide and is controlled by a servo or stepping motor control system which is rotated by a source voltage applied from the outside and controls the linear motion.

The reflector enabling the interferometer to measure the movement position of the stage is positioned at both perpendicular edges of the stage. The reflector will be described as a movable mirror in the description of the interferometer.

The interferometer includes a light source for generating a laser beam of a predetermined wavelength; a beam splitter for dividing the laser beam generated from the light source into a reference laser beam and a plurality of measurement laser beams and processing these beams; a reference mirror fixed to the support structure, for reflecting the reference laser beam, divided and progressed by the beam splitter, to the beam splitter; a movable mirror positioned on a sidewall of the stage, corresponding to the reference mirror, for reflecting the measurement laser beams while being moved; a sighting mirror for allowing the measurement laser beams to be incident on the movable mirror and returning the measurement laser beams reflected in the movable mirror to the beam splitter; and a detector for measuring a movement distance of the movable mirror, using the coherence of the reference laser beam and measurement laser beams returned to the beam splitter by the sighting mirror. The laser beam is an electromagnetic wave having a single wavelength. The laser beam has a proper and uniform single wavelength according to material used for the light source and is amplified to a predetermined intensity.

Accordingly, since the laser beam does not diffuse in a three-dimensional space, its directionality is high. Further, since the laser beam is the electromagnetic wave of a single wavelength, it is widely used in general devices for measurement and display, using the interference effects. When the reference laser beam and measurement laser beams, which are separated from each other in the beam splitter and respectively reflected in the reference mirror and movable mirror, are returned to the beam splitter, these beams are superimposed to cause constructive interference or destructive interference depending on phase difference, thereby forming an interference fringe of a predetermined intensity. As is known, such an interference phenomenon is mathematically described by Formula 1, wherein I, $I_1$, and $I_2$ are respectively the intensity of the interference fringe, the intensity of the reference laser beam, and the intensity of the measurement laser beams, and δ is the relative phase difference between the reference laser beam and the measurement laser beams.

$$I=I_1+I_2+2\sqrt{I_1I_2}\cos\delta \quad \text{[Formula 1]}$$

A change in the intensity of the interference fringe is caused by the phase difference (δ). Accordingly, when the number of moving interference fringes is measured by the detector, the position of the movable mirror is calculated by Formula 2.

$$X = X_0 + N\frac{\lambda}{2} \quad \text{[Formula 2]}$$

In Formula 2, X indicates the displacement of the movable mirror in the x-axial direction, $X_0$ indicates an initial position of the movable mirror in the x-axial direction, N indicates the number of interference fringes, and λ indicates the specific single wavelength of the laser beam. Accordingly, the conventional interferometer measures the movement distance of the movable mirror in the x-axial direction, by detecting $X_0$ in the x-axial direction and the number of interference fringes. The interferometer also measures the movement distance of the movable mirror in the y-axial direction, by detecting $Y_0$ in the y-axial direction and the number of interference fringes. To measure yaw and tilt of the stage on which the movable mirror is positioned, which are corresponding to the degree of freedom of the stage, the interferometer may be designed apart from the x-axial or y-axial direction. To measure the yaw and tilt of the stage, the interferometer includes an additional movable mirror, in which an azimuth and a tilt in the x- or y-axial direction are measured with respect to a reference portion in the z-axial direction of the stage.

Accordingly, the conventional displacement interferometric system includes the interferometer to measure the movement distance of the movable mirror, using the interference phenomenon of the laser beam of single wavelength, thereby measuring the movement distance of the stage horizontally moved on the support structure and measuring the yaw and tilt of the stage.

However, the conventional displacement interferometric system has the following problems.

First, when the sighting mirror is shaken or yawed on the support structure by the vibration of the stage being moved horizontally, the angle of incidence of the laser beam for measurement is changed, thereby reducing the intensity of the measurement laser beams which are incident and reflected on the movable mirror and which are detected in the detector through the sighting mirror. Furthermore, it is not easy to catch the change of the sighting mirror and to correct the change, thereby decreasing productivity.

Second, the change in the angle of incidence of the measurement laser beams is recognized depending on the intensity of the measurement laser beams which are detected in the detector. However, it takes a long time to accurately correct the angle of incidence of the measurement laser beams, thereby decreasing the productivity.

Third, the change in the angle of incidence of the measurement laser beams being incident by the sighting mirror cannot be measured in real-time. Furthermore, when measuring the overlay of the surface of a wafer after the exposure and patterning processes, an alignment failure of the wafer positioned on the stage is only indirectly caught. This causes a failure in the exposure process of a number of wafers, thereby decreasing the yield of production.

SUMMARY OF THE INVENTION

Therefore, the present invention provides a displacement interferometer system which readily measures and corrects a change in an angle of incidence of a measurement laser beam which is caused by the vibration of a stage being horizontally moved, thereby increasing or maximizing productivity.

The present invention also provides a displacement interferometer system which shortens correction time required for accurately correcting an angle of incidence of a measurement laser beam, thereby increasing or maximizing productivity.

The present invention also provides a displacement interferometer system which directly measures a change in an angle of incidence of a measurement laser beam in real-time and prevents a failure in a wafer exposure process, thereby increasing or maximizing yield of production.

In accordance with one aspect, the present invention is directed to a displacement interferometer system comprising: a light source for generating a laser beam of a predetermined wavelength; an incidence unit for allowing the laser beam to be incident on a target object to be measured; a detector for measuring a distance of the target object to be measured, using a measurement laser beam which is incident on the target object from the incidence unit; and a correction unit coupled to the incidence unit so that a correction laser beam is incident in a direction parallel to the measurement laser beam which is incident on the target object to be measured, and, when the correction laser beam and the measurement laser beam which are yawed from an initially set direction are incident in any one direction, the correction unit correcting the correction laser beam and the measurement laser beam to be incident in the initially set direction.

In one embodiment, the displacement interferometer system further comprises: a first beam splitter for dividing the laser beam generated in the light source into a reference laser beam and a measurement laser beam and progressing the reference laser beam and the measurement laser beam; a reference mirror which is fixedly positioned, the reference mirror for reflecting the reference laser beam, which is divided and progressed in the first beam splitter, to be returned to the first beam splitter; and a movable mirror which is movably positioned on the target object to be measured, corresponding to the reference mirror, the movable mirror for movably reflecting the measurement laser beam to be returned to the incidence unit and the first beam splitter. In one embodiment, the first beam splitter allows the reference laser beam and the measurement laser beam, which are respectively returned by the reference mirror and the movable mirror, to be incident on the detector.

In one embodiment, the incidence unit comprises a first sighting mirror for reflecting the laser beam generated in the light source, changing a path of the laser beam and allowing the laser beam to be incident on the target object to be measured.

In one embodiment, the correction unit may comprise: an auxiliary sighting unit for allowing the correction laser beam, which is separately generated in the light source or which is divided from the laser beam generated in the light source, to be incident in the direction parallel to the laser beam which is incident on the target object by the incidence unit; a first sight which is positioned to be close to the auxiliary sighting unit and through which the correction laser beam, which is incident by the auxiliary sighting unit, passes and progresses; a second sight which is positioned to be spaced apart from the first sight and through which the correction laser beam, which progresses through the first sight, passes and progresses; and a correction sensor for sensing the correction laser beam passing and progressing through the second sight. Preferably, the correction unit may further comprise: a controller for determining whether an angle of incidence of the correction laser beam, which passes through the first and second sights and is sensed by the correction sensor, is normal, and, when the angle of incidence of the correction laser beam is abnormal, for outputting an interlock control signal; and an indicator for indicating an extent of a change in the angle of incidence of the correction laser beam, using the control signal being output by the controller. Preferably, the auxiliary sighting unit may comprise a second beam splitter for separating the correction laser beam from the laser beam and allowing the correction laser beam to be incident on the first and second sights, or a second sighting mirror for allowing the correction laser beam to be incident on the first and second sights. Preferably, the auxiliary sighting unit may further comprise a connection unit for fixedly connecting the second beam splitter or the second sighting mirror to the incidence unit.

According to another aspect, the present invention is directed to a displacement interferometer system comprising: a light source for generating a laser beam of a predetermined wavelength, using a source voltage applied from the outside; a first beam splitter for dividing the laser beam generated in the light source into a reference laser beam and a measurement laser beam and progressing the reference laser beam and the measurement laser beam; a reference mirror for returning the reference laser beam, which is divided and progressed in the first beam splitter, to the first beam splitter; a first sighting mirror for allowing the measurement laser beam, which is progressed in the first beam splitter, to be incident in a direction in which a stage moves on a predetermined support structure; a movable mirror for reflecting the measurement laser beam, which is incident from the first sighting mirror, to the first sighting mirror, and for returning the measurement laser beam to the first beam splitter while moving along the stage; a detector for measuring a movement distance of the movable mirror, using a coherence of the measurement laser beam and the reference laser beam which are respectively reflected by the movable mirror and the reference mirror and returned to the first beam splitter; and a correction unit for measuring a yaw of the first sighting mirror resulting from a vibration caused by the movement of the stage, and for correcting the yaw.

In one embodiment, the first beam splitter comprises a half mirror for allowing about one half intensity of the laser beam which is incident in one direction to be progressed as it is and about the other half intensity of the laser beam to be reflected and progressed in a perpendicular direction.

In one embodiment, the first sighting mirror allows the measurement laser beam to be perpendicularly incident and reflected on the movable mirror in the front of the wafer stage.

In one embodiment, the first beam splitter allows the reference laser beam and the measurement laser beam, which are respectively returned by the reference mirror and the movable mirror, to be incident on the detector.

In one embodiment, the correction unit comprises: an auxiliary sighting unit for allowing the correction laser beam, which is separately generated in the light source or which is divided from the laser beam generated in the light source, to be incident in the direction parallel to the laser beam which is incident on the target object to be measured; a first sight which is positioned to be close to the auxiliary sighting unit and through which the correction laser beam being incident by the auxiliary sighting unit passes and progresses; a second sight which is positioned to be spaced apart from the first sight and through which the correction laser beam progressing through the first sight passes and progresses; and a correction sensor for sensing the correction laser beam passing and progressing through the second sight.

In one embodiment, the correction unit comprises: a controller for determining whether an angle of incidence of the correction laser beam, which passes through the first and second sights and is sensed by the correction sensor, is normal, and, when the angle of incidence of the correction laser beam is abnormal, for outputting an interlock control signal; and an indicator for indicating an extent of a change in the angle of incidence of the correction laser beam, using the control signal being output by the controller.

In one embodiment, the auxiliary sighting unit comprises a second beam splitter for separating the correction laser beam from the laser beam and allowing the correction laser beam to be incident on the first and second sights, or a second sighting mirror for allowing the correction laser beam to be incident on the first and second sights.

In one embodiment, the auxiliary sighting unit further comprises a connection unit for fixedly connecting the second beam splitter or the second sighting mirror to the first sighting mirror.

In one embodiment, the connection unit comprises a connection bar for connecting a first housing to a second housing, the first housing for enclosing an outside of the first sighting mirror, and the second housing for enclosing the first In one embodiment, the first sight is fixed to the second housing.

In one embodiment, the first sight and the second sight have grids with the same or similar number of slits in the same or similar direction.

In one embodiment, the slit is 7 µm in size.

In one embodiment, when the slits are arranged widthwise, a yaw of the second sighting mirror in the direction of azimuth is measured, and when the slits are arranged lengthwise, a tilt angle of the second sighting mirror in the direction of the height of the second sighting mirror is measured.

In one embodiment, the second sight and the correction sensor are integrally combined and fixed on the support structure.

In one embodiment, the correction sensor includes an image sensor.

In one embodiment, the image sensor includes a complementary metal-oxide semiconductor (CMOS) image sensor and a charge coupled device (CCD) image sensor.

According to another aspect, the present invention is directed to an exposer comprising: an exposure light source for generating light of a short wavelength of an ultraviolet region; a reticle for transferring the light of short wavelength, which is supplied by the exposure light source, to a predetermined pattern image; an optical system including an objective lens for transferring the light of short wavelength to the reticle and for reducing and projecting the light of short wavelength being transferred through the reticle; a wafer stage for supporting, aligning and plane-moving a wafer so that the pattern image is reduced and projected at a corresponding position of the wafer; and a displacement interferometer system including a correction unit for measuring a horizontal movement distance of the wafer stage, and, when an angle of incidence of a measurement laser beam which is incident on a movable mirror positioned at one side of the wafer stage in order to measure the horizontal movement distance is changed, for correcting the angle of incidence of the measurement laser beam.

In one embodiment, the correction unit comprises: a laser light source for generating a correction laser beam of a predetermined intensity, using a source voltage applied from the outside; an auxiliary sighting unit for allowing the correction laser beam, which is generated in the laser light source, to be incident in a direction parallel to the measurement laser beam; a first sight which is positioned to be close to the auxiliary sighting unit and through which the correction laser beam being incident by the auxiliary sighting unit passes and progresses; a second sight which is positioned to be spaced apart from the first sight and through which the correction laser beam progressing through the first sight passes and progresses; and a correction sensor for sensing the correction laser beam passing and progressing through the second sight.

In one embodiment, the correction unit comprises: a controller for determining whether an angle of incidence of the correction laser beam, which passes through the first and second sights and is sensed by the correction sensor, is normal, and, when the angle of incidence of the correction laser beam is abnormal, for outputting an interlock control signal; and an indicator for indicating an extent of a change in the angle of incidence of the correction laser beam, using the control signal being output by the controller.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shape of elements may be exaggerated for clarity. Where the function and constitution are well-known in the relevant arts, further discussion will not be presented in the detailed description in order not to unnecessarily make the gist of the present invention unclear.

Figure 1:
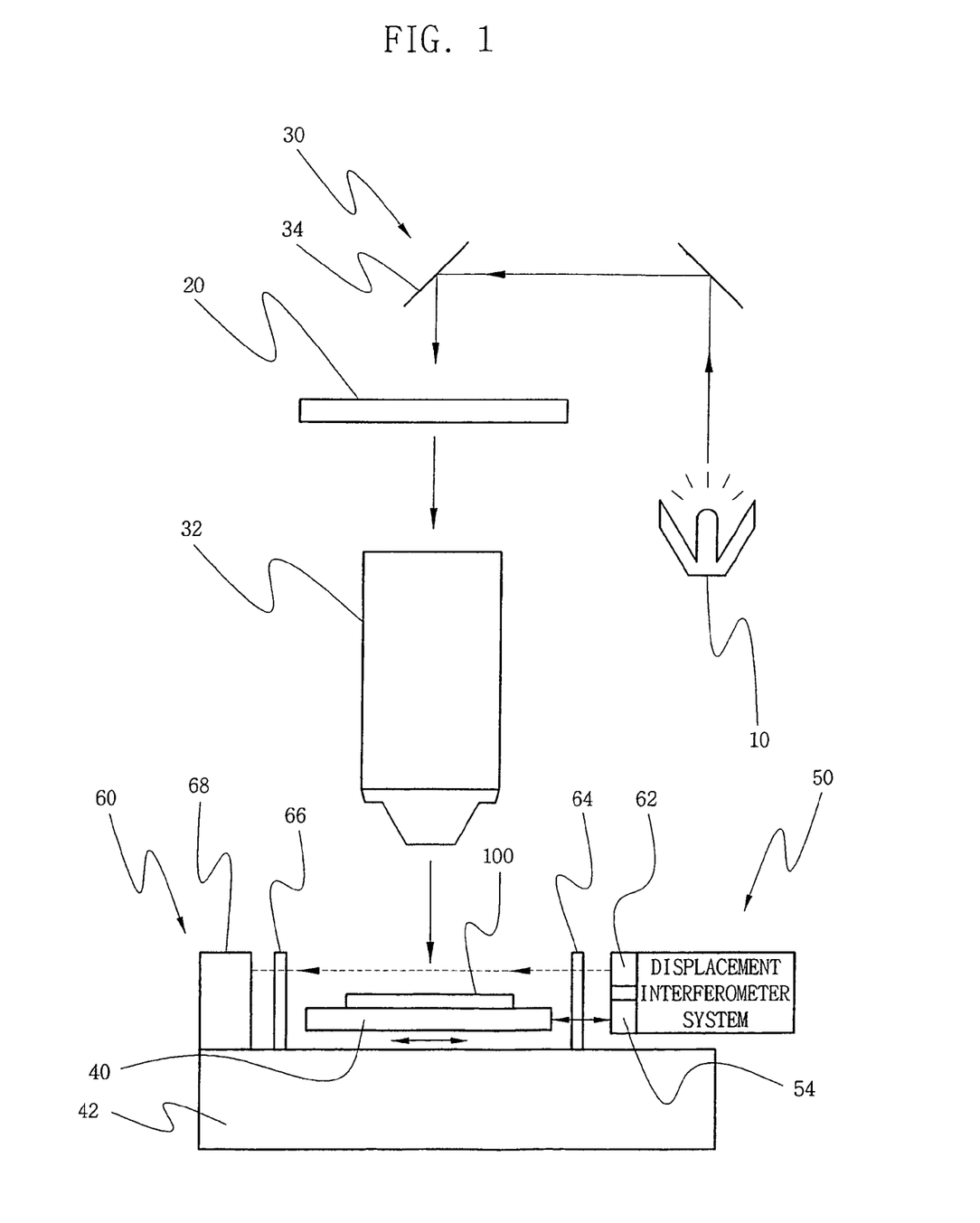
FIG. 1 is a diagram schematically illustrating an exposer in accordance with an embodiment of the present invention.

FIG. 1 is a diagram schematically illustrating an exposer in accordance with an embodiment of the present invention.

As illustrated in FIG. 1, the exposer comprises an exposure light source 10 generating a light of a short wavelength in a ultraviolet region; a reticle 20 transferring the light of short wavelength, which is supplied by the exposure light source 10, to a predetermined pattern image; an optical system 30 including an objective lens 32 transferring the light of short wavelength through the reticle 20 and reducing and projecting the light of short wavelength transferred through the reticle 20; a wafer Is stage 40 supporting, aligning and plane-moving a wafer 100 so that the pattern image is reduced and projected at a corresponding position of the wafer 100; and a displacement interferometer system 50 including a correction unit 60 to correct an angle of incidence of a measurement laser beam (76 of FIG. 2) which is incident on a movable mirror formed at a side of the wafer stage 40 when any change occurs in the angle of incidence of the measurement laser beam 76 to measure and monitor a horizontal movement distance of the wafer stage 40.

The exposure light source 10 generates the light of short wavelength, using a source voltage of high power applied from the outside. For example, the light of short wavelength generated in the exposure light source 10 may include g-line beam (435 nm), i-line beam (365 nm), KrF excimer laser beam (248 nm), ArF excimer laser beam (193 nm), fluoride dimmer beam (F2, 157 nm), and extreme ultra violet beam (EUV, 13 nm).

The optical system 30 projects the light of short wavelength generated in the exposure light source 10 on the reticle 20 so that the pattern image formed on the reticle 20 is transferred. The optical system 30 projects the light of short wavelength transferred in the pattern image onto the surface of the wafer 100. For example, the optical system 30 further comprises an optic tube, a convex lens, a concave lens, or a short wavelength optic mirror 34 to ideally change only an optical path, without loss of light. To increase the depth of focus (DOF) of the light of short wavelength, the optical system 30 may further comprise an illumination system. The illumination system diffracts the light of short wavelength generated in the exposure light source 10 by the image formation principal of the $0^{th}$ and/or $\pm 1^{st}$ order diffraction light and selectively extracts the light with high directionality from the diffracted light. The objective lens 32 of the optical system 30 for reducing and projecting the pattern image transferred from the reticle 20 includes a complex body of a plurality of the convex lens and concave lens having a predetermined radius between the wafer 100 and the reticle 20. When the objective lens 32 is described as one convex lens, the whole pattern image can be reduced and projected on the surface of the wafer 100 as the radius of the convex lens becomes larger. When the wafer 100 and the reticle 20 are fixed on the wafer stage 40, a stepper exposer is used to transfer the whole pattern image on the surface of the wafer 100, to correspond the whole pattern image to one chip or a plurality of chips. However, since the radius of the objective lens cannot be manufactured to be unlimitedly large, a scanner exposer is used. In the scanner exposer, when a section of the pattern image corresponds to the maximum radius of the objective lens and while the reticle 20 and the wafer stage 40 are moved in a direction parallel to each other, the pattern image is transferred to correspond to one chip or a plurality of chips. In the scanner exposer, an exposure process is performed while the reticle 20 is moved horizontally. For this reason, the scanner exposer may further include the displacement interferometer system 50 for monitoring the movement of a reticle stage (not shown) to move the reticle 20.

When the light of short wavelength with the pattern image is transferred on the wafer 100 from the optical system 30, the reticle 20 is used as a mask to form a predetermined image pattern to be formed on the wafer 100. For example, the reticle 20 comprises a transparent glass substrate (not shown) through which the light of short wavelength is transmitted, and a pattern layer (not shown) formed of a metal layer, such as black nickel chrome, for absorbing the light of short wavelength so that the light of short wavelength transmitted through the transparent glass substrate is transferred with the pattern image.

The wafer stage 40 is adapted to move the wafer 100 horizontally on a support structure 42 positioned to be horizontal from the surface of the ground. For example, the wafer stage 40 is moved, along a linear motion (LM) guide (not shown) which is linearly formed on the support structure 42, by rotation power of a servo motor or a stepping motor. The wafer stage 40 may be shaken slightly when the servo motor or stepping motor generates the power of rotation or depending on the degree of planarity of the LM guide block. For example, when the initial planarity of the LM guide block is imperfect or when the intensity of the LM guide block is low and a predetermined life time is expired, self-vibration may be caused by deformation. Similarly, in the reticle stage of the scanner exposer, the self-vibration may be caused during the exposure process. The weak vibration that occurs while the wafer stage 40 is moved may change the angle of incidence of the measurement laser beam 76 which is incident by a first sighting mirror 54 of the displacement interferometer system 50 to measure the movement distance of the wafer stage 40. Thus, the exposer in accordance with the embodiment of the present invention comprises the correction unit 60 for catching the change in the angle of incidence of the measurement laser beam 76 being incident by the first sighting mirror 54 of the displacement interferometer system 50, and for correcting the changed angle of incidence of the measurement laser beam 76, thereby preventing the wrong measurement of the displacement interferometer system 50 due to the weak vibration.

The displacement interferometer system 50 is an optical system which measures the movement distance, with the accuracy of maximally about 1 nm, using the physical phenomenon of interference of light, which results from a change in the optical path length of a measuring beam which passes a target object to be measured, compared to a fixed optical path length of a reference beam.

Figure 2:
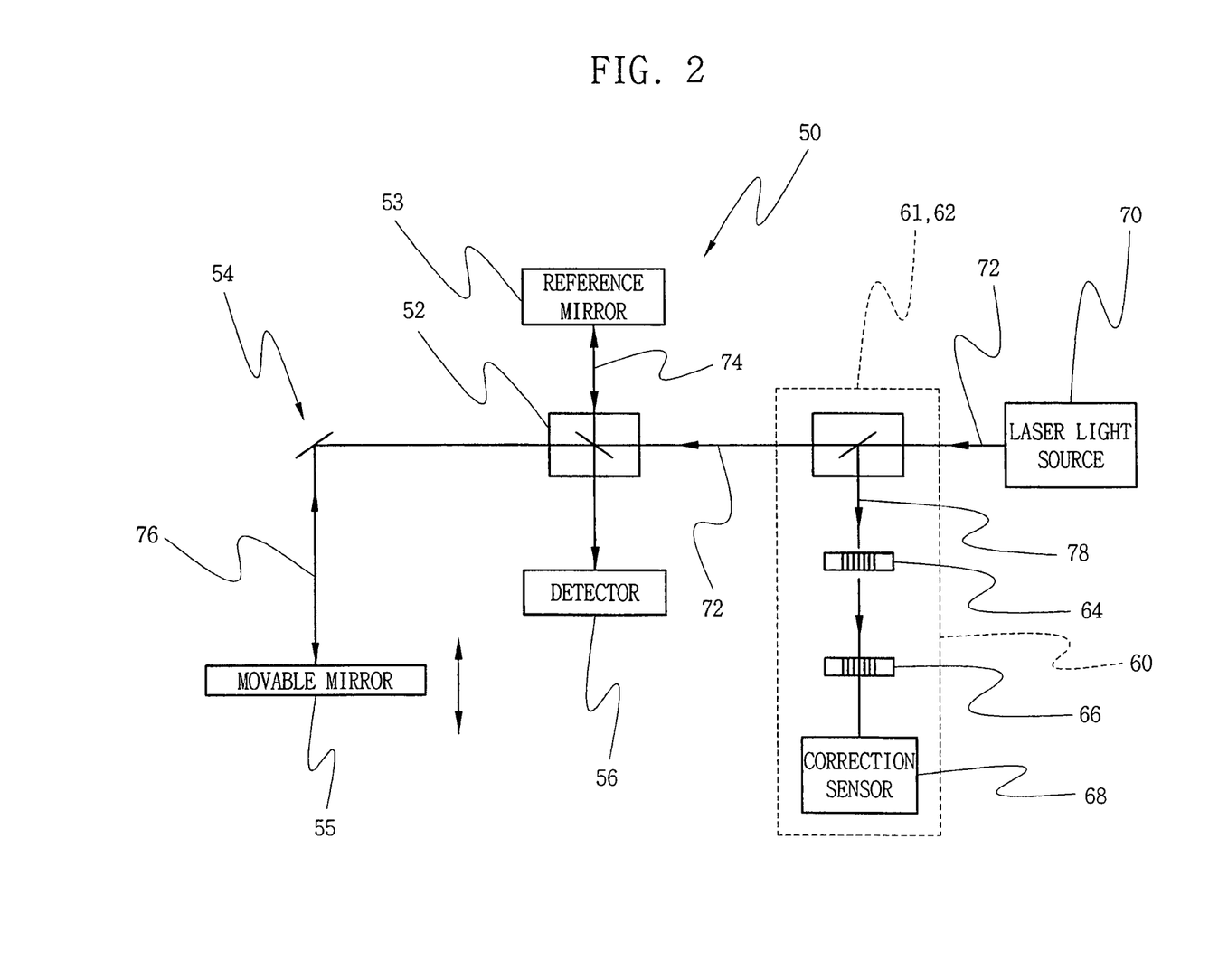
FIGS. 2 and 3 are diagrams illustrating a displacement interferometer system of FIG. 1.
Figure 3:
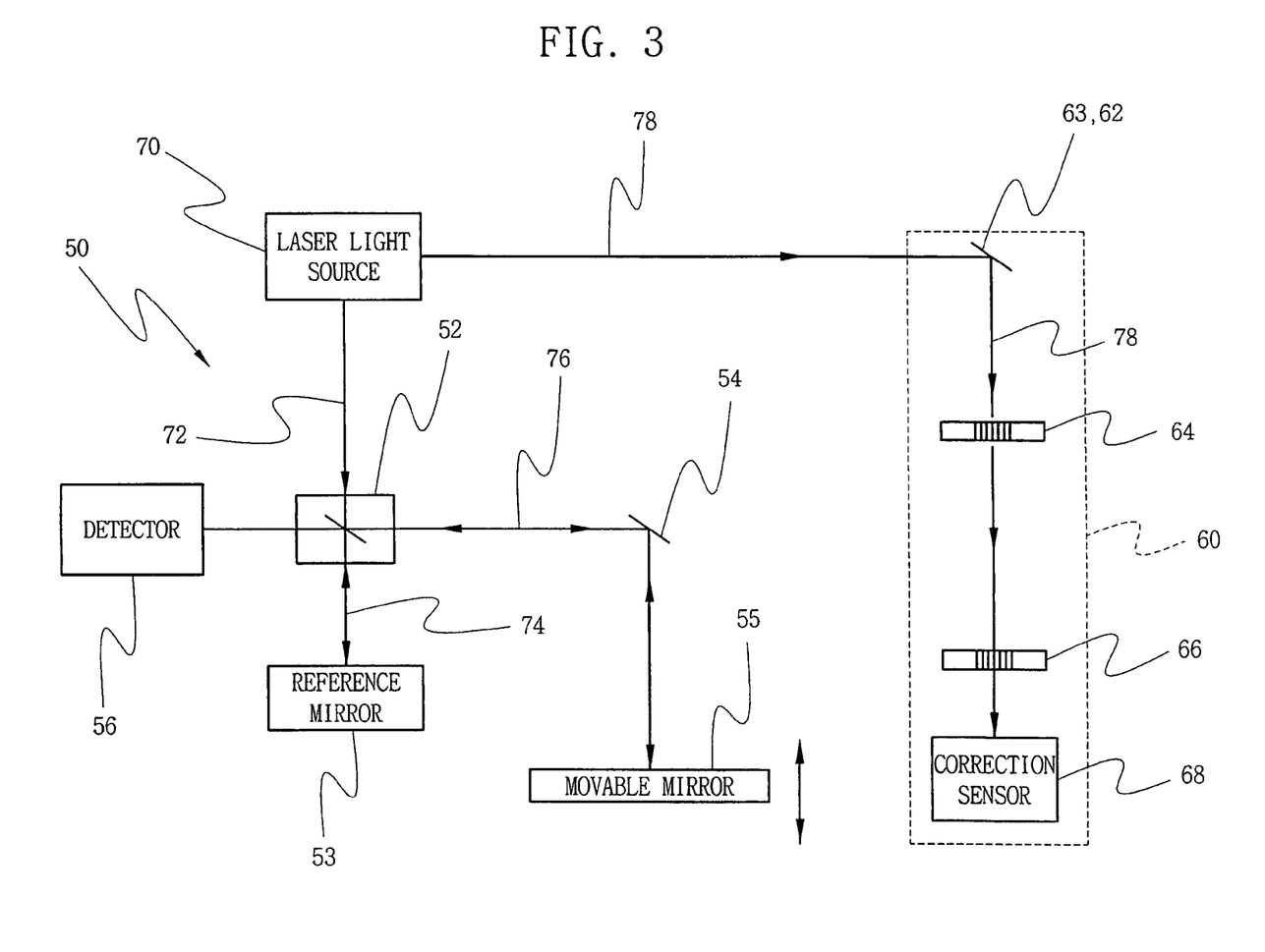
Figure 4:
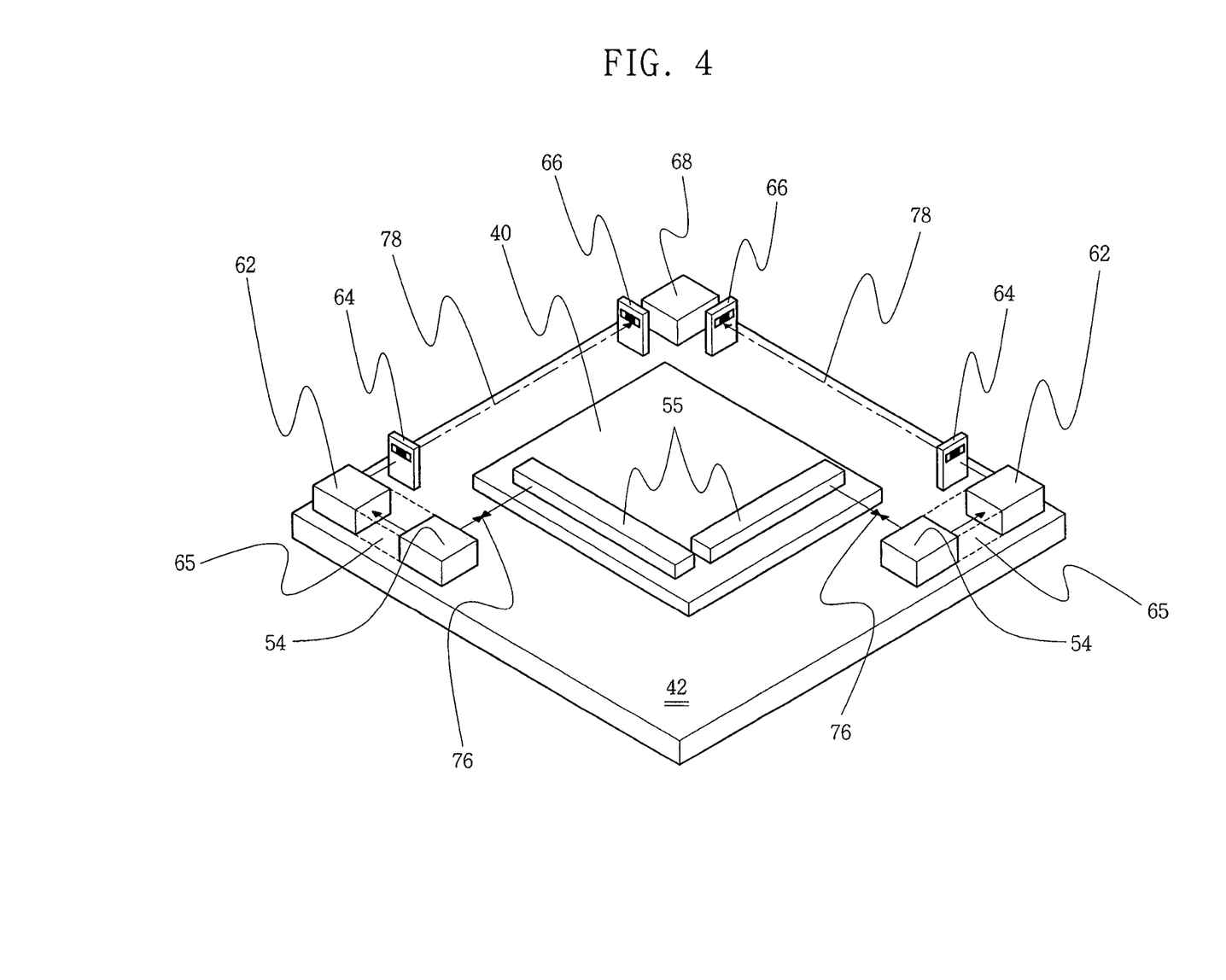
FIG. 4 is a perspective view illustrating the displacement interferometer system shown in FIGS. 2 and 3.

FIGS. 2 and 3 are diagrams illustrating the displacement interferometer system 50 of FIG. 1, and FIG. 4 is a perspective view illustrating the displacement interferometer system 50 shown in FIGS. 2 and 3.

As illustrated in FIGS. 2 through 4, the displacement interferometer system 50 in accordance with the present invention comprises: a laser light source 70 for generating a laser beam 72 of a predetermined wavelength, using a source voltage applied from the outside; a first beam splitter 52 for dividing the laser beam 72 generated in the light source 70 into a reference laser beam 74 and a measurement laser beam 76 and propagating the reference and measurement laser beams 74 and 76; a reference mirror 53 for returning the reference laser beam 74, which is divided in the first beam splitter 52, to the first beam splitter 52; a first sighting mirror 54 (for example, an incidence unit) for allowing the measurement laser beam 76, which is propagated by the first beam splitter 52, to be incident in a direction in which the wafer stage 40 is moved on the support structure 42; a movable mirror 55 for reflecting the measurement laser beam 76, which is incident by the first sighting mirror 54, to the first sighting mirror 54 and for returning the measurement laser beam 76 to the first beam splitter 52; a detector 56 for measuring the movement distance of the movable mirror 55, using the coherence of the returning measurement laser beam 76 and the reference laser beam 74 which are respectively reflected in the movable mirror 55 and the reference mirror 53 and returned to the first beam splitter 52; and a correction unit 60 for measuring a yaw of the first sighting mirror 54, caused by the vibration of the wafer stage 40 or by the movement of the wafer stage 40 and for correcting the distortion.

The laser light source 70 is generally called a laser which is a device for amplifying or oscillating electromagnetic waves of the wavelength of the infrared or visible ray region by applying quantum mechanics. When a specific matter is electrically excited in an excited state and an outermost electron of the specific matter is transited from a metastable state to a stable state, the laser beam 72 of a uniform wavelength in the visible ray region is emitted. The laser light source 70 is an apparatus for emitting such laser beam 72. For example, the laser light source 70 may generate one laser beam 72 and separately direct the laser beam 72 to the first beam splitter 52 and the correction unit 60 as shown in FIG. 2. Alternatively, the laser light source 70 may generate different laser beams 72 and 78 and separately direct the beams to the first beam splitter 52 and to the correction unit 60 as shown in FIG. 3.

The first beam splitter 52 may divide the laser beam 72 of a predetermined intensity, which is generated in the laser light source 70, into the reference laser beam 74 and the measurement laser beam 76 and direct the beams 74 and 76 in two or more different directions. For example, the beam splitter includes a half mirror which allows about one half intensity of the laser beam 72 which is incident in one direction to be directed through the half mirror and about the other half intensity of the laser beam 72 to be reflected and directed by the half mirror in a perpendicular direction. When the measurement laser beam 76 is incident on the movable mirror 55 in the first beam splitter 52 though it is not shown, the first beam splitter 52 may be the incidence unit which allows the measurement laser beam 76 to be incident on the movable mirror 55. The first beam splitter 52 superimposes the reference laser beam 74 and the measurement laser beam 76 which are returned in different directions and allows the reference and measurement laser beams 74 and 76 to be incident on the detector 56. The reference laser beam 74 and the measurement laser beam 76 superimposed by the first beam splitter 52 have interference fringes of a predetermined intensity, which occur due to the interference phenomenon and are incident on the detector 56. As described above, the intensity of the interference fringes is determined by the constructive interference or destructive interference due to the phase difference between the reference laser beam 74 and the measurement laser beam 76, and the interference fringes are different. The interference fringes periodically and repeatedly appear depending on a change of the measurement laser beam 76. Accordingly, the detector 56 calculates the number of the interference fringes that appear by the superposition of the reference laser beam 74 and the measurement laser beam 76 and detects the distance that the movable mirror 55 is moved, by reading the phase difference between the reference laser beam 74 and the measurement laser beam 76. For example, when no phase difference occurs between the measurement laser beam 76 and the reference laser beam 74, the measurement laser beam 76 and the reference laser beam 74 may be detected as having the same or similar intensity as or to the laser beam 72 being incident on the first beam splitter 52 from the light source. When a phase difference occurs between the measurement laser beam 76 and the reference laser beam 74, the measurement laser beam 76 and the reference laser beam 74 appear depending on the trigonometrical function of the phase difference and are detected as having intensity which is less than the intensity of the laser beam 72 being incident on the first beam splitter 52 in the light source.

The detector 56 is an apparatus for detecting the intensity of the measurement laser beam 76 and the reference laser beam 74 which are superimposed in the first beam splitter 52, using the photoelectric effect. Accordingly, the detector 56 calculates the number of the interference fringes and the phase difference between the measurement laser beam 76 and the reference laser beam 74 which are superimposed, by reading the extent of a voltage or current which varies depending on the intensity of the measurement laser beam 76 and the intensity of the reference laser beam 74. The photoelectric effect means a phenomenon that a predetermined matter absorbs light and emits a freely movable electron, i.e., a photoelectron. When a minimum energy required for emitting the photoelectron from the matter is indicated as $E_0$, the number of frequency of the measurement laser beam 76 or reference laser beam 74 is indicated as v, Plank's constant is indicated as h, the energy of the photoelectron is $hv-E_0$. In addition, the measurement laser beam 76 and the reference laser beam 74 having the greater frequency than the minimum frequency $v_0$ are absorbed in the matter, thereby generating the photoelectric effect. When a forward or reverse voltage of a predetermined extent is applied to the matter, the measurement laser beam 76 and the reference laser beam 74 are incident, thereby generating the photoelectric effect. Depending on the intensity of the measurement laser beam 76 and the intensity of the reference laser beam 74, the voltage varies and the current increases. A conductive metal is usually used as the matter to induce the photoelectric effect, allowing the measurement laser beam 76 and the reference laser beam 74 to be incident. This photoelectric effect is called an external photoelectric effect. The external photoelectric effect is generally applied to a phototube, and it is widely used for measuring a distance, using the laser beam 72. Accordingly, the detector 56 is capable of reading the number of interference fringes and the phase difference between the measurement laser beam 76 and the reference laser beam 74 which are superimposed in the first beam splitter 52, using the photoelectric effect generated in proportion to the intensity of the laser beam 72. The detector 56 indicates the movement distance of the movable mirror 55 by detecting a change of the wavelength of the measurement laser beam 76 corresponding to the fixed wavelength of the reference laser beam 74, and reflecting the measurement laser beam 76.

The reference mirror 53 is fixed to reflect the reference laser beam 74 and return the reference laser beam 74 to the first beam splitter 52, corresponding to the measurement laser beam 76 which is reflected and returned to the first beam splitter 52 by the movable mirror 55 being changeably moved in distance. The reference mirror 53 is set to have an angle of incidence which is perpendicular to the reference laser beam 74. For example, the distance between the reference mirror 53 and the first beam splitter 52 is set to correspond to a value derived by multiplying the wavelength of the reference laser beam 74 by a positive number, to increase the reflection efficiency of the reference laser beam 74 being reflected in the reference mirror 53 and to increase the interference by the measurement laser beam 76 and the reference laser beam 74 being superimposed in the first beam splitter 52.

The movable mirror 55 is connected to the wafer stage 40. While moving along the wafer stage 40, the movable mirror 55 reflects the measurement laser beam 76. Similarly, the movable mirror 55 is set to have an angle of incidence which is perpendicular to the measurement laser beam 76. The movable mirror 55 is formed to have a predetermined height from one side edge of the wafer stage 40 and positioned to be perpendicular to the movement direction of the wafer stage 40. Accordingly, the measurement laser beam 76 is directed in the same or similar direction as or to the movement direction of the wafer stage 40 and it is to be incident on the movable mirror 55.

The first sighting mirror 54 allows the measurement laser beam 76 to be perpendicularly incident on the movable mirror 55 in the front of the wafer stage 40. To change the optical path of the measurement laser beam 76 being directed between the first beam splitter 52 and the movable mirror 55, the first sighting mirror 54 is fixedly positioned so that the measurement laser beam 76 is incident on the movable mirror 55 in a perpendicular direction. For example, the first sighting mirror 54 is connected on the support structure 42 and is positioned to be close to the wafer stage 40 so that the measurement laser beam 76 is incident to be parallel to the wafer stage 40. As described above, when a connection portion of the first sighting mirror 54 is shaken or loosened such that it is yawed or moved in any one direction, due to the weak vibration caused by the movement of the wafer stage 40, the angle of incidence of the measurement laser beam 76 being reflected in the first sighting mirror 54 may be changed.

To correct for this, the displacement interferometer system 50 in accordance with the present invention comprises the correction unit 60 for monitoring the change in the angle of incidence of the measurement laser beam 76 being incident by the first sighting mirror 54, thereby preventing the wrong measurement by the yaw of the first sighting mirror 54 on the support structure 42. A plurality of the first sighting mirrors 54 for measuring the movement distance of the wafer stage 40 are positioned so as to measure the respective movement distance with respect to the x-axial and y-axial direction in the Cartesian coordinate system. The correction unit 60 may be positioned as shown in FIG. 4, to correct the changed angle of incidence of a plurality of the measurement laser beams 76 being incident with respect to the x-axial and y-axial direction.

The correction unit 60 comprises an auxiliary sighting unit 62 for allowing a correction laser beam 78, which is generated and progressed in the laser light source 70, to be incident in a direction parallel to the measurement laser beam 76; a first sight 64 positioned to be close to the auxiliary sighting unit 62, for passing and progressing the correction laser beam 78 being incident by the auxiliary sighting unit 62; a second sight 66 positioned to be spaced apart from the first sight 64, for passing and progressing the correction laser beam 78 being progressed through the first sight 64; and a correction sensor 68 for sensing the correction laser beam 78 being passed and progressed through the second sight 66.

The correction unit 60 may further comprise a controller (not shown) and an indicator (not shown). The controller determines whether the angle of incidence of the correction laser beam 78, which passes through the first and second sights 64 and 66 and is sensed by the correction sensor 68, is normal or abnormal. When the angle of incidence of the correction laser beam 78 is abnormal, the controller outputs an interlock control signal to the exposer. The indicator indicates the extent of a change in the angle of incidence of the correction laser beam 78, using the control signal being output from the controller.

The auxiliary sighting unit 62 allows the correction laser beam 78 to be incident in the direction spatially parallel to the measurement laser beam 76 which is incident by the first sighting mirror 54. For example, the auxiliary sighting unit 62 may include a second beam splitter 61 which separates the correction laser beam 78 from the laser beam 72 generated in the laser light source 70 and allows the correction laser beam 78 to be incident in the direction towards the first sight 64, the second sight 66 and the correction sensor 68, or the auxiliary sighting unit 62 may include a second sighting mirror 63 which allows the correction laser beam 78 generated and progressed in the laser light source 70 to be incident in the direction towards the first sight 64, the second sight 66 and the correction sensor 68.

Figure 5:
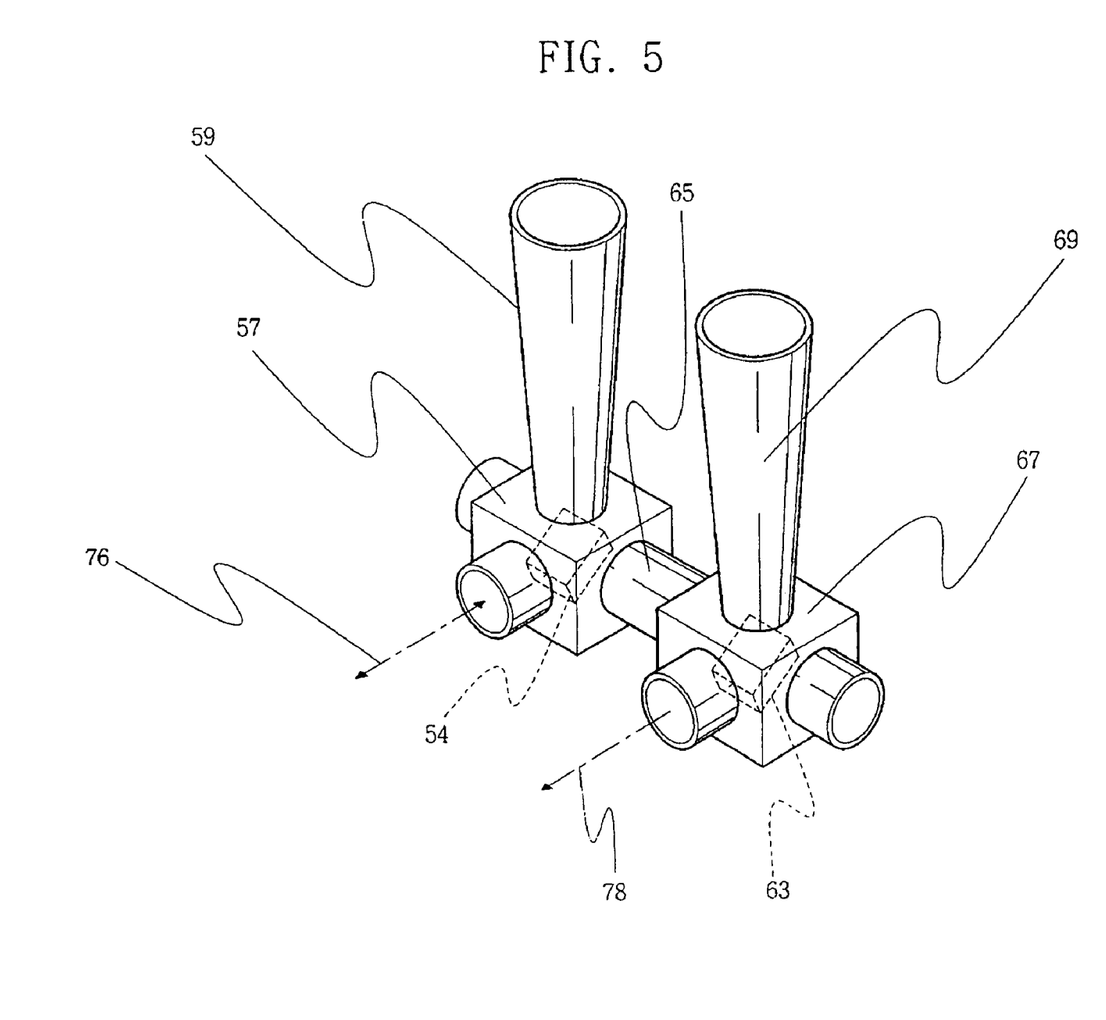
FIG. 5 is a perspective view illustrating the combination of a first sighting mirror and a second sighting mirror shown in FIG. 3.

FIG. 5 is a perspective view illustrating the combination of the first sighting mirror 54 and the second sighting mirror 63 shown in FIG. 3. The second sighting mirror 63 is operatively connected to the first sighting mirror 54 so that the correction laser beam 78 and the measurement laser beam 76 are progressed in the direction parallel to each other. When the connection portion (not shown) of the first sighting mirror 54 becomes loose on the support structure 42 by the weak vibration and is yawed in a direction of azimuth or tilted upwardly and downwardly, the second sighting mirror 63 is designed to be changed in its position, along with the first sighting mirror 54. For example, the first sighting mirror 54 is fixedly connected to the second sighting mirror 63 by a connection unit 65 which is positioned to be perpendicular to the measurement laser beam 76 and the correction laser beam 78.

The connection unit 65 comprises a connection bar for connecting a first housing 57 which encloses the outside of the first sighting mirror 54 to a second housing 67 which encloses the first beam splitter 52 or the outside of the second sighting mirror 63. An optic tube is positioned to be perpendicular to the connection unit 65. The optic tube allows the measurement laser beam 76 and the correction laser beam 78 to be incident by the first sighting mirror 54 and the second sighting mirror 63. When the measurement laser beam 76 measures the movement of the wafer stage 40 in the x-axial direction of the Cartesian coordinate system, the connection unit 65 is positioned in the y-axial direction being perpendicular to the x-axial direction and a first optic tube 59 and a second optic tube 69 are positioned in the z-axial direction.

Accordingly, the displacement interferometer system 50 in accordance with the present invention readily corrects the yaw of the first sighting mirror 54, using the correction unit 60 including the auxiliary sighting unit 62 which allows the correction laser beam 78 to be incident in the direction parallel to the measurement laser beam 76 being incident on the movable mirror 55 by the first sighting mirror 54.

Figure 6:
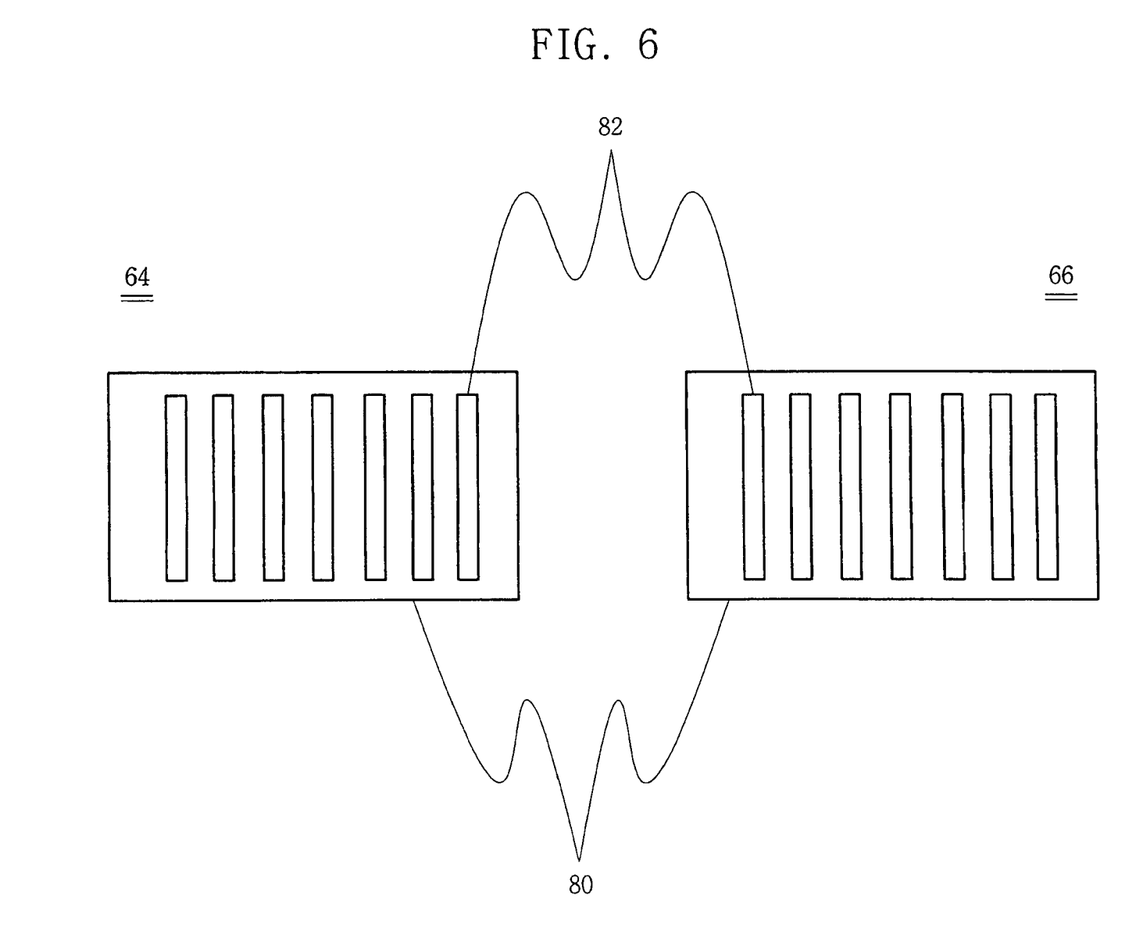
FIGS. 6 and 7 are views illustrating a first sight and a second sight shown in FIGS. 2 and 3.
Figure 7:
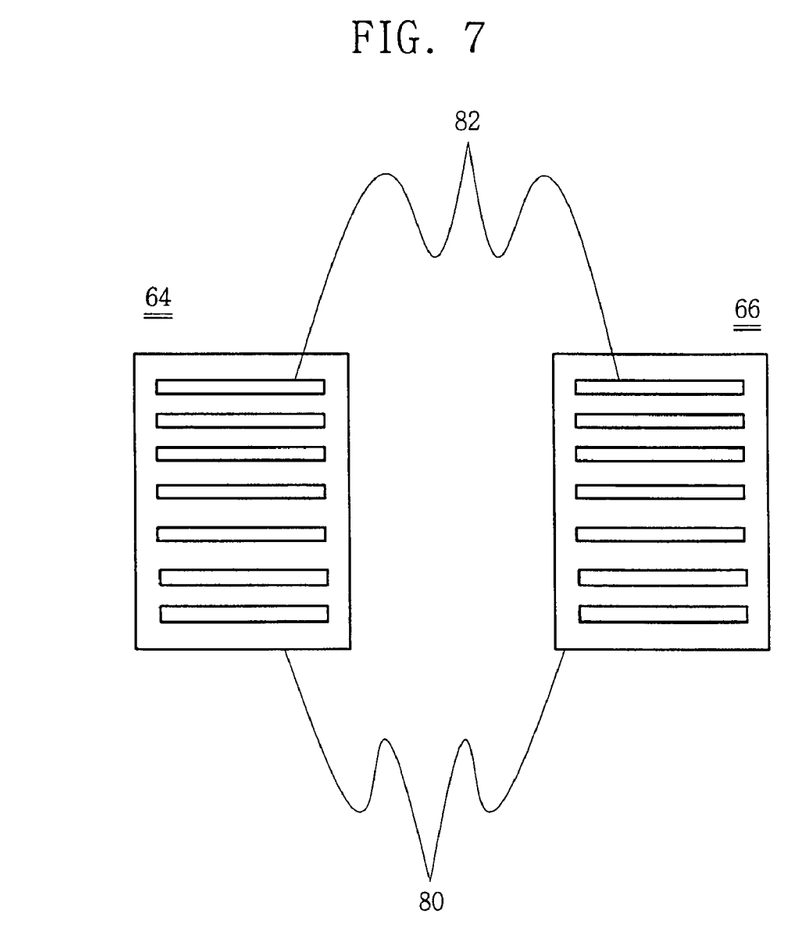

FIGS. 6 and 7 are views illustrating the first sight 64 and the second sight 66 shown in FIGS. 2 and 3. The first sight 64 and the second sight 66 have the same or similar grids 80. The first sight 64 corresponds to the second sight 66 one to one. For example, the first sight 64 and the second sight 66 include the grids 80 with about seven slits 82 which are regularly arranged, each slit 82 being about 7 μm in size widthwise or lengthwise. The first sight 64 and the second sight 66 may include one slit 82 (not shown) through which the correction laser beam 78 passes. Only when the correction laser beam 78 is incident in the way that the same number of grids 80 appears in the first sight 64 and the second sight 66, respectively, the accurate correction is made. When the slits 82 of the grid 80 formed in the first sight 64 and the second sight 66 are arranged widthwise, the yaw of the second sighting mirror 63 in the direction of azimuth is measured. When the slits 82 of the grid 80 are arranged lengthwise, the tilt of the second sighting mirror 63 in the direction of the height thereof is measured. The auxiliary sighting unit 62 and the first sight 64 aim the correction laser beam 78 at the second sight 66 and allow the correction laser beam 78 to be incident. The first sight 64 is positioned to be close to the auxiliary sighting unit 62 and the second sight 66 is positioned to be close to the correction sensor 68, thereby readily determining the extent of the change in the angle of incidence of the correction laser beam. The first sight 64 is fixedly connected to the second housing 67 of the second sighting mirror 63. However, to prevent the second sighting mirror 63, which is fixedly connected to the first sighting mirror 54 being subject to correction, from being moved in connection with the first sight 64, the first sight 64 may be separated from the second housing 67 of the second sighting mirror 63 and be fixedly positioned on the support structure 42. The correction laser beam 78 being incident through the second sight 66 is progressed to the correction sensor 68. The second sight 66 may be integrated with the correction sensor 68 and fixed on the support structure 42. The correction unit 60 in accordance with the present invention allows the correction laser beam 78, which is incident through the slit 82 of the first sight 64 in the second sighting mirror 63, to pass through the slit 82 of the second sight 66 corresponding to the slit 82 of the first sight 64, thereby determining the angle of incidence of the second sighting mirror 63 aiming the correction laser beam 78. For example, the correction sensor 68 senses whether the correction laser beam 78 which is incident through the third slit 82 of the first sight 64 is incident through the third slit 82 of the second sight 66. The correction sensor 68 senses the correction laser beam 78 which is progressed through the grids 80 of the first sight 64 and second sight 66, and the controller determines whether the orientation of the angle of incidence of the second sighting mirror 63 is normal.

As described above, the displacement interferometer system 50 in accordance with the present invention includes the correction unit 60 comprising the auxiliary sighting unit 62 for allowing the correction laser beam 78 to be incident in the direction parallel to the measurement laser beam 76 for measuring the movement distance of the wafer stage 40, the first and second sights 64 and 66 for arraying the correction laser beam 78 being incident by the auxiliary sighting unit 62, and the correction sensor 68 for sensing the correction laser beam 78 being progressed through the first and second sights 64 and 66. Accordingly, even though the angle of incidence of the measurement laser beam 76 being incident by the first sighting mirror 54 is yawed by the vibration of the wafer stage 40 being moved horizontally, the displacement interferometer system readily measures the yaw in the angle of incidence of the first sighting mirror 54 and corrects the yaw, thereby increasing or maximizing the productivity.

The correction sensor 68 senses the correction laser beam 78 being progressed through the second sight 66, thereby allowing the controller to determine whether the measurement laser beam 76 being incident in the direction parallel to the correction laser beam 78 is normally incident. For example, the correction sensor 68 includes an image sensor for sensing an image through the grids 80 of the first and second sights 64 and 66, using the photoelectric effect. Image sensors are typically broadly characterized as camera tubes or solid state imaging device. The camera tube includes a vidicon or a plumbicon. The solid state imaging device includes a complementary metal-oxide semiconductor (CMOS) image sensor and a charge coupled device (CCD) image sensor. The camera tube has low cost and long life span for use. However, since the camera tube has low resolution and large volume, it is difficult to install the camera tube on the exposer. Compared to the camera tube, the solid state imaging device is an integrated semiconductor image sensing device, and it may be called a camera plate. The solid state imaging device solidifies the whole group of pixels which are two-dimensionally arrayed (specific pixels may be one-dimensionally arrayed) on a semiconductor substrate on which the visible ray is incident, so that the photoelectric transformation and electric charge accumulation function of the pixels are integrated with the scanning function of sequentially reading a charge image accumulated at the pixels. Since the solid state imaging device has high resolution and small volume, it is readily installed on the exposer. The semiconductor substrate is generally a silicon substrate having a single crystal structure, and the pixels are formed in a matrix array on the semiconductor substrate. The solid state imaging device generates an output signal current by sequentially reading a charge image according to a method of scanning electric charge of the pixel which is a minimum unit consisting of the charge image. In the solid state imaging device, the photoelectric transformation-accumulation-scanning (reading) functions are important. A basic method for the solid state imaging device is a charge transfer method by which a structurally separate and independent pixel is sequentially transferred and read out through a scanning signal generator. When a signal is transferred by a light receiver receiving the correction laser beam 78 in the visible ray region, the CMOS image sensor uses a MOS transistor, and the CCD type image sensor uses a charge coupled device. The CCD image sensor consists of integrated circuits which include fundamental constituent elements, such as a diode with a semiconductor thin film and a number of electrodes positioned on the surface thereof, or a passive element like resistance. The CCD forms an insulating layer having the thickness of about 0.1 m on the surface of an n-type semiconductor substrate of a semiconductor device, arranges a metal electrode and controls the voltage of the metal electrode, thereby moving, side to side, a portion with low electric potential on the semiconductor surface. Since the CCD sequentially transfers accumulated electric charges, it would be applied as a shift register or a memory device. The CCD has a similar simple structure as the MOS transistor and has two functions, i.e., memory by accumulation of electric charges, and transfer by movement of the electric charges. Since the CCD can be densely integrated, it is widely used in industries.

As described above, the displacement interferometer system 50 in accordance with the present invention includes the correction sensor 68 comprising the solid state imaging device which senses the correction laser beam 78 being incident in the direction parallel to the measurement laser beam 76 and progressing through the first and second sights 64 and 66. Accordingly, the displacement interferometer system 50 measures, in real-time, the yaw in the angle of incidence of the measurement laser beam 76 being incident by the first sighting mirror 54.

The controller determines whether the correction laser beam 78 progresses to the initially set position and has the angle of incidence of a set value, using the signal of sensing the correction laser beam 78, which is output from the correction sensor 68. The controller is also capable of determining whether the angle of incidence of the measurement laser beam 76, which is incident on the movable mirror 55 in the direction parallel to the correction laser beam 78, is correct. When it is determined that the correction laser beam 78 is yawed in the direction of azimuth or is progressed at an angle, the controller outputs an interlock control signal to the whole exposer, so that the distance measurement using the measurement laser beam 76 parallel to the correction laser beam 78 is not further performed.

As described above, the displacement interferometer system 50 in accordance with the present invention includes the correction sensor 68 to sense the correction laser beam 78 being incident in the direction parallel to the measurement laser beam 76 and progressing through the first and second sights 64 and 66, thereby measuring, in real-time, the yaw in the angle of incidence of the measurement laser beam 76 being incident by the first sight mirror 54. Upon occurrence of the yaw in the angle of incidence of the measurement laser beam 76, since the controller outputs the interlock control signal not to perform the distance measurement using the measurement laser beam 76, the displacement interferometer system 50 prevents a failure in the wafer exposure process which is caused by the yaw in the angle of incidence of the measurement laser beam 76, thereby increasing or maximizing the yield of production.

The indicator receives the interlock control signal being output from the controller and indicates that the alignment process or exposure process cannot be further performed in the exposer. The indicator also indicates the extent of a change in the angle of incidence of the correction laser beam 78, thereby enabling an operator to perceive the change.

For example, when the extent of the yaw in the angle of incidence of the correction laser beam 78 in the direction of azimuth or tilt is determined, the controller controls the indicator to indicate the extent of the yaw and changes the orientation of the second sighting mirror 63 of the auxiliary sighting unit to change the direction in which the correction laser beam 78 progresses, thereby readily correcting the angle of incidence of the measurement laser beam 76 which is incident in the direction parallel to the correction laser beam 78.

As described above, the displacement interferometer system 50 in accordance with the present invention allows the correction laser beam 78 to be incident in the direction parallel to the measurement laser beam 76 which is incident to measure the movement distance of the wafer stage 40 supporting the wafer 100 during the exposure process. Since the displacement interferometer system 50 includes the correction unit 60 for sensing the yaw in the angle of incidence of the correction laser beam 78, and the controller for outputting the control signal to correct the angle of incidence of the correction laser beam 78 sensed by the correction unit 60, a correction time for accurately correcting the angle of incidence of the measurement laser beam 76 is shortened, thereby increasing or maximizing the productivity.

In accordance with the present invention, the displacement interferometer system comprises the correction unit including the auxiliary sighting unit for allowing the correction laser beam to be incident in the direction parallel to the measurement laser beam to measure the movement distance of the wafer stage supporting the wafer to be subject to the exposure process, the first and second sights for arraying the correction laser beam being incident by the auxiliary sighting unit, and the correction sensor for sensing the correction laser beam progressing through the first and second sights. In accordance with the displacement interferometer system having the above configuration, even though the angle of incidence of the measurement laser beam being incident by the first sighting mirror is yawed by the vibration of the stage being moved horizontally, the yaw in the angle of incidence of the first sighting mirror is easily measured and corrected, thereby increasing or maximizing the productivity.

Furthermore, the displacement interferometer system comprises the correction unit for allowing the correction laser beam to be incident in the direction parallel to the measurement laser beam being incident to measure the movement distance of the stage and sensing the yaw in the angle of incidence of the correction laser beam, and the controller for outputting the control signal to correct the angle of incidence of the correction laser beam being sensed through the correction unit. In accordance with the displacement interferometer system having the above configuration, the correction time required for accurately correcting the angle of incidence of the measurement laser beam is shortened, thereby increasing or maximizing the productivity.

Furthermore, the displacement interferometer system comprises the correction sensor for sensing the correction laser beam which is incident in the direction parallel to the measurement laser beam and progresses through the first and second sights, thereby measuring, in real-time, the yaw in the angle of incidence of the measurement laser beam being incident by the first sighting mirror. Upon occurrence of the yaw in the angle of incidence of the measurement laser beam, since the displacement interferometer system comprises the controller for outputting the interlock control signal so that the distance measurement using the measurement laser beam is not to be performed, a failure during the wafer exposure process is prevented from occurring by the yaw in the angle of incidence of the measurement laser beam, thereby increasing and maximizing the yield of production.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A displacement interferometer system comprising:
   a light source for generating a laser beam of a predetermined wavelength;
   an incidence unit for allowing the laser beam to be incident on a target object to be measured;
   a detector for measuring a distance of the target object to be measured, using a measurement laser beam which is incident on the target object by the incidence unit; and
   a correction unit coupled to the incidence unit so that a correction laser beam is incident in a direction parallel to the measurement laser beam which is incident on the target object to be measured, and, when the correction laser beam and the measurement laser beam which yaw from an initially set direction are incident in any one direction, the correction unit correcting the correction laser beam and the measurement laser beam to be incident in the initially set direction.

2. The displacement interferometer system according to claim 1, further comprising:
   a first beam splitter for dividing the laser beam generated in the light source into a reference laser beam and a measurement laser beam and progressing the reference laser beam and the measurement laser beam;
   a reference mirror which is fixedly positioned, the reference mirror for reflecting the reference laser beam, which is divided and progressed in the first beam splitter, to be returned to the first beam splitter; and
   a movable mirror which is movably positioned on the target object to be measured, corresponding to the reference mirror, the movable mirror for movably reflecting the measurement laser beam to be returned to the incidence unit and the first beam splitter.

3. The displacement interferometer system according to claim 2, wherein the first beam splitter allows the reference laser beam and the measurement laser beam, which are respectively returned by the reference mirror and the movable mirror, to be incident on the detector.

4. The displacement interferometer system according to claim 1, wherein the incidence unit comprises a first sighting mirror for reflecting the laser beam generated in the light source, changing a path of the laser beam and allowing the laser beam to be incident on the target object to be measured.

5. The displacement interferometer system according to claim 1, wherein the correction unit comprises:
   an auxiliary sighting unit for allowing the correction laser beam, which is separately generated in the light source or which is divided from the laser beam generated in the light source, to be incident in the direction parallel to the laser beam which is incident on the target object to be measured;
   a first sight which is positioned to be close to the auxiliary sighting unit and through which the correction laser beam being incident by the auxiliary sighting unit passes and progresses;
   a second sight which is positioned to be spaced apart from the first sight and through which the correction laser beam progressing through the first sight passes and progresses; and
   a correction sensor for sensing the correction laser beam passing and progressing through the second sight.

6. The displacement interferometer system according to claim 5, further comprising:
   a controller for determining whether an angle of incidence of the correction laser beam, which passes through the first and second sights and is sensed by the correction sensor, is normal, and, when the angle of incidence of the correction laser beam is abnormal, for outputting an interlock control signal; and
   an indicator for indicating an extent of a change in the angle of incidence of the correction laser beam, using the control signal being output by the controller.

7. The displacement interferometer system according to claim 5, wherein the auxiliary sighting unit comprises a second beam splitter for separating the correction laser beam from the laser beam and allowing the correction laser beam to be incident on the first and second sights, or a second sighting mirror for allowing the correction laser beam to be incident on the first and second sights.

8. The displacement interferometer system according to claim 7, wherein the auxiliary sighting unit further comprises a connection unit for fixedly connecting the second beam splitter or the second sighting mirror to the incidence unit.

9. A displacement interferometer system comprising:
   a light source for generating a laser beam of a predetermined wavelength, using a source voltage applied from the outside;
   a first beam splitter for dividing the laser beam generated in the light source into a reference laser beam and a measurement laser beam and progressing the reference laser beam and the measurement laser beam;
   a reference mirror for returning the reference laser beam, which is divided and progressed in the first beam splitter, to the first beam splitter;
   a first sighting mirror for allowing the measurement laser beam, which is progressed in the first beam splitter, to be incident in a direction in which a stage moves on a predetermined support structure;
   a movable mirror for reflecting the measurement laser beam, which is incident by the first sighting mirror, to the first sighting mirror and for returning the measurement laser beam to the first beam splitter while moving along the stage;
   a detector for measuring a movement distance of the movable mirror, using a coherence of the measurement laser beam and the reference laser beam which are respectively reflected by the movable mirror and the reference mirror and returned to the first beam splitter; and a correction unit for measuring a yaw of the first sighting mirror resulting from a vibration caused by the movement of the stage and for correcting the yaw.

10. The displacement interferometer system according to claim 9, wherein the first beam splitter comprises a half mirror for allowing about one half intensity of the laser beam which is incident in one direction to be progressed as it is and about the other half intensity of the laser beam to be reflected and progressed in a perpendicular direction.

11. The displacement interferometer system according to claim 9, wherein the first sighting mirror allows the measurement laser beam to be perpendicularly incident and reflected on the movable mirror in the front of the wafer stage.

12. The displacement interferometer system according to claim 9, wherein the first beam splitter allows the reference laser beam and the measurement laser beam, which are respectively returned by the reference mirror and the movable mirror, to be incident on the detector.

13. The displacement interferometer system according to claim 9, wherein the correction unit comprises:

an auxiliary sighting unit for allowing the correction laser beam, which is separately generated in the light source or which is divided from the laser beam generated in the light source, to be incident in the direction parallel to the laser beam which is incident on the target object to be measured;

a first sight which is positioned to be close to the auxiliary sighting unit and through which the correction laser beam being incident by the auxiliary sighting unit passes and progresses;

a second sight which is positioned to be spaced apart from the first sight and through which the correction laser beam progressing through the first sight passes and progresses; and a correction sensor for sensing the correction laser beam passing and progressing through the second sight.

14. The displacement interferometer system according to claim 13, wherein the correction unit comprises:

a controller for determining whether an angle of incidence of the correction laser beam, which passes through the first and second sights and is sensed by the correction sensor, is normal, and, when the angle of incidence of the correction laser beam is abnormal, for outputting an interlock control signal; and an indicator for indicating an extent of a change in the angle of incidence of the correction laser beam, using the control signal being output by the controller.

15. The displacement interferometer system according to claim 13, wherein the auxiliary sighting unit comprises a second beam splitter for separating the correction laser beam from the laser beam and allowing the correction laser beam to be incident on the first and second sights, or a second sighting mirror for allowing the correction laser beam to be incident on the first and second sights.

16. The displacement interferometer system according to claim 15, wherein the auxiliary sighting unit further comprises a connection unit for fixedly connecting the second beam splitter or the second sighting mirror to the first sighting mirror.

17. The displacement interferometer system according to claim 16, wherein the connection unit comprises a connection bar for connecting a first housing to a second housing, the first housing for enclosing an outside of the first sighting mirror, and the second housing for enclosing the first beam splitter or an outside of the second sighting mirror.

18. The displacement interferometer system according to claim 17, wherein the first sight is fixed to the second housing.

19. The displacement interferometer system according to claim 13, wherein the first sight and the second sight have grids with the same or similar number of slits in the same or similar direction.

20. The displacement interferometer system according to claim 19, wherein the slit is 7μm in size.

21. The displacement interferometer system according to claim 19, wherein when the slits are arranged widthwise, a yaw of the second sighting mirror in the direction of azimuth is measured, and when the slits are arranged lengthwise, a tilt angle of the second sighting mirror in the direction of the height of the second sighting mirror is measured.

22. The displacement interferometer system according to claim 13, wherein the second sight and the correction sensor are integrally combined and fixed on the support structure.

23. The displacement interferometer system according to claim 13, wherein the correction sensor includes an image sensor.

24. The displacement interferometer system according to claim 23, wherein the image sensor includes a complementary metal-oxide semiconductor (CMOS) image sensor and a charge coupled device (CCD) image sensor.

25. An exposer comprising:

an exposure light source for generating light of a short wavelength of an ultraviolet region;

a reticle for transferring the light of short wavelength, which is supplied from the exposure light source, to a predetermined pattern image;

an optical system including an objective lens for transferring the light of short wavelength to the reticle and for reducing and projecting the light of short wavelength being transferred through the reticle;

a wafer stage for supporting, aligning and plane-moving a wafer so that the pattern image is reduced and projected at a corresponding position of the wafer; and a displacement interferometer system including a correction unit for measuring a horizontal movement distance of the wafer stage, and, when an angle of incidence of a measurement laser beam, which is incident on a movable mirror positioned at one side of the wafer stage in order to measure the horizontal movement distance, is changed, for correcting the angle of incidence of the measurement laser beam, wherein the correction unit comprises:

a laser light source for generating a correction laser beam of a predetermined intensity, using a source voltage applied from the outside;

an auxiliary sighting unit for allowing the correction laser beam, which is generated in the laser light source, to be incident in a direction parallel to the measurement laser beam;

a first sight which is positioned to be close to the auxiliary sighting unit and through which the correction laser beam being incident by the auxiliary sighting unit passes and progresses;

a second sight which is positioned to be spaced apart from the first sight and through which the correction laser beam progressing through the first sight passes and progresses; and a correction sensor for sensing the correction laser beam passing and progressing through the second sight.

26. The exposer according to claim 25, wherein the correction unit comprises:

a controller for determining whether an angle of incidence of the correction laser beam, which passes through the first and second sights and is sensed by the correction sensor, is normal, and, when the angle of incidence of the correction laser beam is abnormal, for outputting an interlock control signal; and an indicator for indicating an extent of a change in the angle of incidence of the correction laser beam, using the control signal being output by the controller.

* * * * *